| (12) | United States Patent | (10) Patent No.: | US 7,894,276 B2 |
|---|---|---|---|
| | Lee | (45) Date of Patent: | Feb. 22, 2011 |

(54) APPARATUS AND METHODS FOR AN INPUT CIRCUIT FOR A SEMICONDUCTOR MEMORY APPARATUS

(75) Inventor: Sang-Kwon Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 286 days.

(21) Appl. No.: 12/170,221

(22) Filed: Jul. 9, 2008

(65) Prior Publication Data

US 2009/0175091 A1 Jul. 9, 2009

(30) Foreign Application Priority Data

Jan. 7, 2008 (KR) .................. 10-2008-0001589

(51) Int. Cl.
*G11C 7/00* (2006.01)
(52) U.S. Cl. .................. 365/189.05; 365/229; 365/233; 365/230.08
(58) Field of Classification Search ............ 365/189.05, 365/229, 230.08, 233
See application file for complete search history.

(56) References Cited

U.S. PATENT DOCUMENTS

| 6,621,761 | B2 * | 9/2003 | Akaogi et al. ............ 365/233.1 |
| 6,636,443 | B2 * | 10/2003 | Kang .................... 365/189.05 |
| 6,859,414 | B2 | 2/2005 | Koo |
| 7,020,031 | B2 | 3/2006 | Shin et al. |
| 2002/0024882 | A1 * | 2/2002 | Ikeda ........................ 365/233 |
| 2007/0127296 | A1 | 6/2007 | Cha |

FOREIGN PATENT DOCUMENTS

| KR | 1020020095066 | 12/2002 |
| KR | 1020040057344 A | 7/2004 |

* cited by examiner

*Primary Examiner*—Son Dinh
(74) *Attorney, Agent, or Firm*—Baker & McKenzie LLP

(57) ABSTRACT

An input circuit for a semiconductor memory apparatus comprising a input unit configured to selectively latch a plurality of external signals and output the latched signal; and a control unit coupled to the input unit, the control unit configured to control the operations of the input unit according to an operation mode of the semiconductor memory apparatus is described herein.

20 Claims, 8 Drawing Sheets

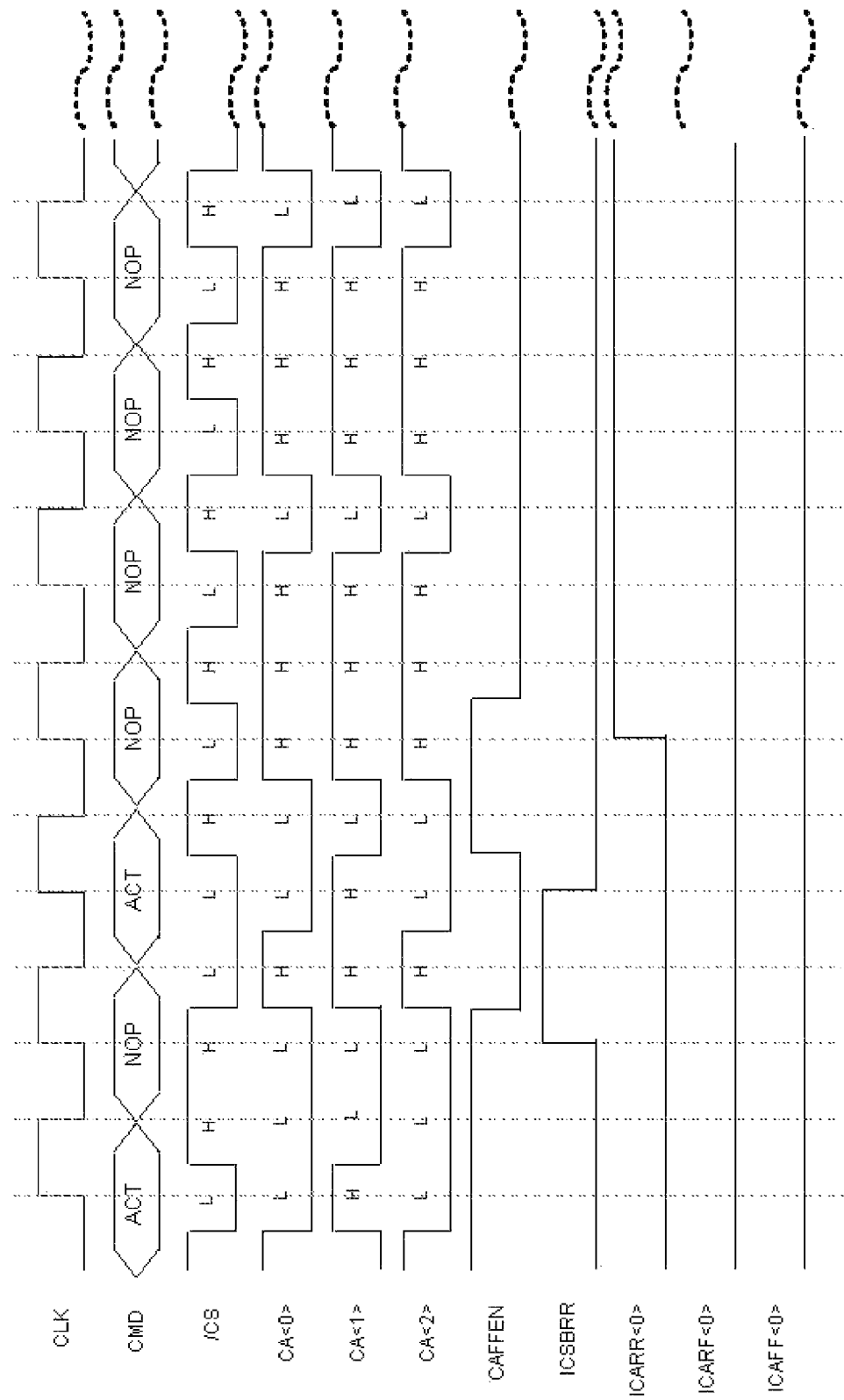

APPARATUS AND METHODS FOR AN INPUT CIRCUIT FOR A SEMICONDUCTOR MEMORY APPARATUS

CROSS-REFERENCE TO RELATED PATENT APPLICATION

This application claims the benefit under 35 U.S.C. 119(a) of Korean Patent Application No. 10-2008-0001589, filed on Jan. 7, 2008, in the Korean Intellectual Property Office, the disclosure of which is incorporated herein in its entirety by reference, as if set forth in full.

BACKGROUND

1. Technical Field

The embodiments described herein relate to a semiconductor memory apparatus, and in particular, to an input circuit for a semiconductor memory apparatus and a control method thereof.

2. Related Art

A conventional input circuit for a semiconductor memory apparatus is illustrated in the block diagram of FIG. 1. Referring to FIG. 1, an input circuit for a conventional semiconductor memory apparatus includes a chip-selection-signal latch circuit 1, a first command/address latch circuit 2, a second command/address latch circuit 3, and a third command/address latch circuit 4.

The chip-selection-signal latch circuit 1 is configured to latch a chip selection signal "/CS" according to a clock signal "CLK". The chip-selection-signal latch circuit 1 includes a CARR latch. The CARR latch is configured to latch an input signal at a rising edge of the clock signal "CLK".

The first command/address latch circuit 2 is configured to latch command/address signals "CA<0:#>" according to the clock signal "CLK". The first command/address latch circuit 2 includes a plurality of CARR latches. A command and address may be input through separate pins or a common pin according to the kind of semiconductor memory apparatus. The circuit shown in FIG. 1 is an example in which a command and address are input through a common pin.

The second command/address latch circuit 3 is configured to latch output signals "ICARR<0:#>" of the first command/address latch circuit 2 according to the clock signal "CLK". The second command/address latch circuit 3 includes a plurality of CARF latches. Each of the CARF latches is configured to latch an input signal at a falling edge of the clock signal "CLK".

The third command/address latch circuit 4 is configured to latch the command/address signals "CA<0:#>" according to the clock signal "CLK". The third command/address latch circuit 4 includes a plurality of CAFF latches. Each of the CAFF latches is configured to latch an input signal at a falling edge of the clock signal "CLK".

FIG. 2 is a timing chart illustrating the operation of the input circuit of FIG. 1.

Referring to a signal "ICSBRR", it can be seen that the chip-selection-signal latch circuit 1 latches the chip selection signal "/CS" at a rising edge of the clock signal "CLK". Referring to a signal "ICARR<0>", it can be seen that the first command/address latch circuit 2 latches the command/address signal "CA<0>" at a rising edge of the clock signal "CLK". Referring to a signal "ICARF<0>", it can be seen that the second command/address latch circuit 3 latches the output signal "ICARR<0>" of the first command/address latch circuit 2 at a falling edge of the clock signal "CLK". Referring to a signal "ICAFF<0>", it can be seen that the third command/address latch circuit 4 latches the command/address signal "CA<0>" at a falling edge of the clock signal "CLK".

Thus, even in a non-operation (NOP) mode in which the semiconductor memory apparatus does not perform an active operation, such as a read or write operation, all latched signals are toggled.

FIG. 2 shows only certain of three latched signals, i.e., "ICSBRR", "ICARR<0>", "ICARF<0>", and "ICAFF<0>", however, all the latched signals "ICSBRR", "ICARR<0:#>", "ICARF<0:#>", and "ICAFF<0:#>" are toggled in the same manner. Toggling of the latched signals result from the operations of all the latch circuits 1 to 4, which may cause unnecessary power consumption in the NOP mode.

Accordingly, excessive power consumption can occur in a conventional input circuit due to the unnecessary toggling of various signals even in the NOP mode. It will be understood that power consumption is a major concern for semiconductor memory apparatus and the devices they go into. Therefore, it is often essential to minimize the amount of power consumption.

SUMMARY

Input circuits for a semiconductor memory apparatus and a control method thereof that are capable of reducing power consumption are described herein.

According to one aspect, an input circuit for a semiconductor memory apparatus can include a plurality of latches each configured to selectively latch a plurality of external signals and output the latched signal, and a control unit that can be configured to control the operations of the plurality of latches according to an operation mode of the semiconductor memory apparatus.

According to one aspect, an input circuit for a semiconductor memory apparatus can include a plurality of latches each of which can be configured to selectively latch a plurality of external signals and to output a latched signal according to a control signal, and a control unit that can be configured to use the latched signals to determine an operation mode of the semiconductor memory apparatus, and to generate the control signal according to the determined operation mode.

According to still another aspect, an input circuit for a semiconductor memory apparatus can include a first latch that can be configured to latch a chip selection signal at a first timing and to output an output signal, a plurality of second latches each of which can be configured to latch command/address signals at the first timing and to output the latched signals as output signals, a plurality of third latches each of which can be configured to latch the command/address signals at a second timing later than the first timing according to a control signal and to output the latched signals as output signals, and a control unit that can be configured to use the output signal of the first latch and the output signals of the second latches to determine an operation mode of the semiconductor memory apparatus, and to generate the control signal according to the determined operation mode.

According to still another aspect, a method of controlling an input circuit for a semiconductor memory apparatus having a plurality of latches for latching external signals can include determining whether the semiconductor memory apparatus is in a non-operation mode by use of the external signals, and selectively stopping operations of the plurality of latches when it is determined that the semiconductor memory apparatus is in a non-operation mode.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 8 is a timing chart illustrating the operation of the input circuit of FIG. 3.

DETAILED DESCRIPTION

Input circuits for a semiconductor memory apparatus and a control method thereof are described herein. The input circuits for a semiconductor memory apparatus described herein can prevent unnecessary toggling of signals according to the operation mode of the semiconductor memory apparatus, resulting in a reduction in power consumption and improved performance.

Figure 1:
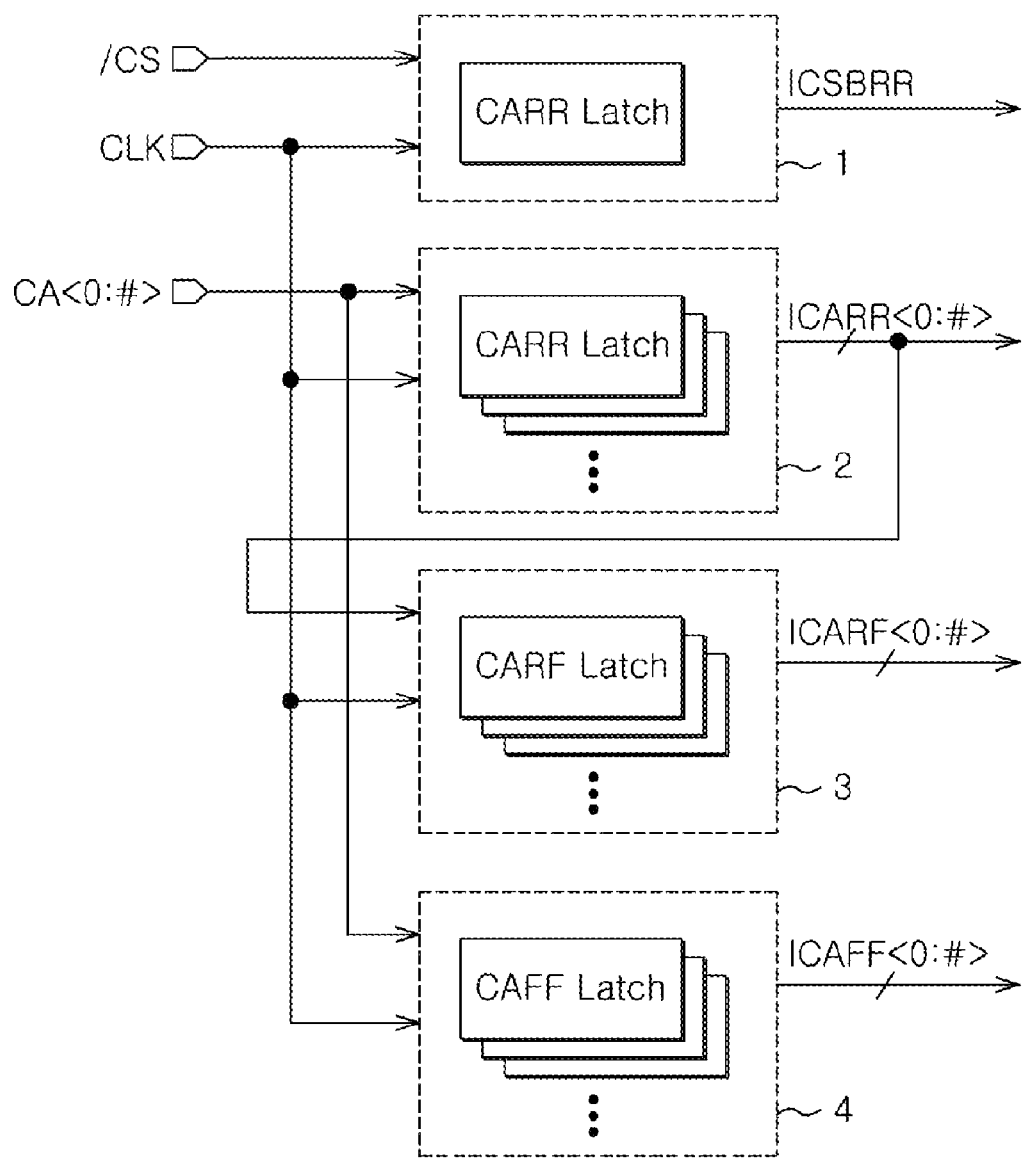
FIG. 1 is a block diagram illustrating a conventional input circuit for a semiconductor memory apparatus.
Figure 2:
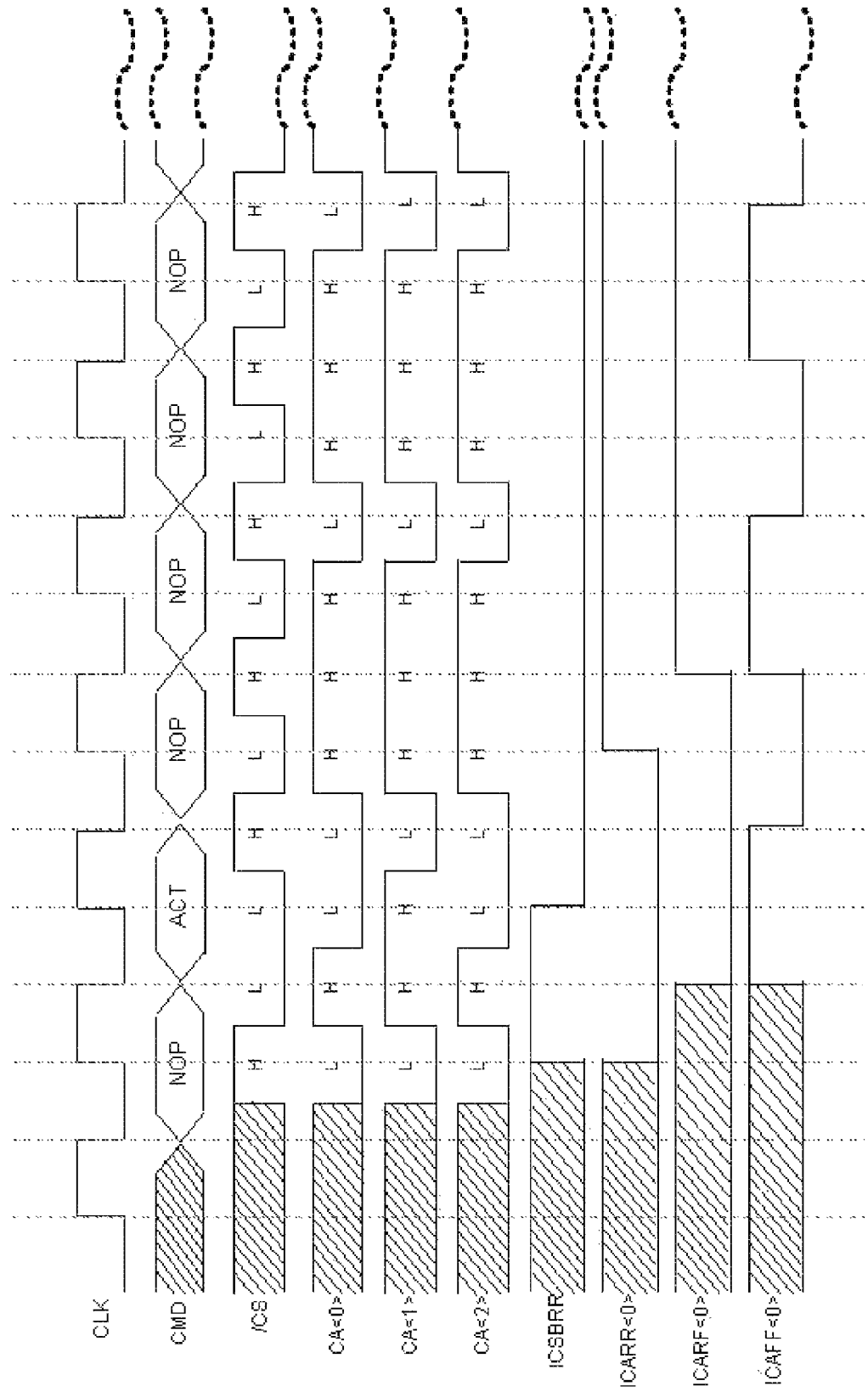
FIG. 2 is a timing chart illustrating the operation of the conventional input circuit for a semiconductor memory apparatus shown in FIG. 1.
Figure 3:
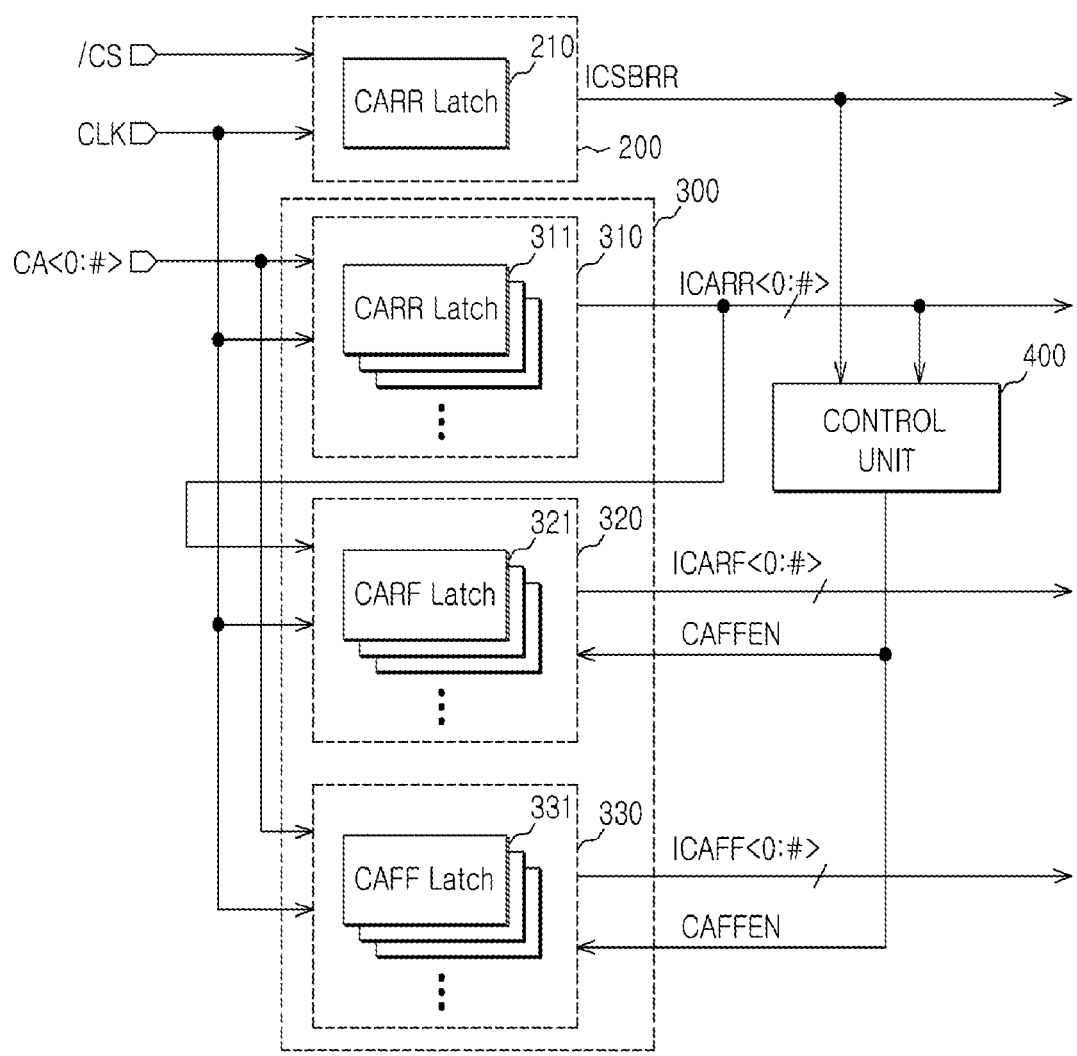
FIG. 3 is a block diagram illustrating an input circuit for a semiconductor memory apparatus according to an embodiment described herein.

FIG. 3 is a block diagram illustrating an input circuit for a semiconductor memory apparatus according to an embodiment described herein. Referring to FIG. 3, the input circuit 100 can include a first input unit 200, a second input unit 300, and a control unit 400.

The first input unit 200 can be configured to latch a chip selection signal "/CS" according to a clock signal "CLK". The first input unit 200 can include a CARR latch 210. The CARR latch 210 can be configured to latch an input signal at a rising edge of the clock signal "CLK".

The second input unit 300 can include first to third latch units 310 to 330 and can be configured to latch the individual bits of the command/address signals "CA<0:#>" at different times. The first latch unit 310 can be configured to latch the command/address signals "CA<0:#>" according to the clock signal "CLK". The first latch unit 310 can include a plurality of CARR latches 311. Each of the CARR latches 311 can have the same configuration as the CARR latch 210.

The second latch unit 320 can be configured to latch output signals "ICARR<0:#>" of the first latch unit 310, according to the clock signal "CLK", when a control signal CAFFEN is activated. The second latch unit 320 can include a plurality of CARF latches 321. Each of the CARF latches 321 can be configured to latch an input signal at a falling edge of the clock signal "CLK".

The third latch unit 330 can be configured to latch the command/address signals "CA<0: #>" according to the clock signal "CLK" when the control signal "CAFFEN" is activated. The third latch unit 330 can include a plurality of CAFF latches 331. Each of the CAFF latches 331 can be configured to latch an input signal at a falling edge of the clock signal "CLK".

The control unit 400 can be configured to use an output signal, that is, the latched chip-selection-signal "ICSBRR" of the first input unit 200 and the output signals "ICARR<0:#>" of the first latch unit 310 to determine whether the semiconductor memory apparatus is in a non-operation mode, and to deactivate the control signal "CAFFEN" when it is determined that the semiconductor memory apparatus is in the non-operation mode.

Figure 4:
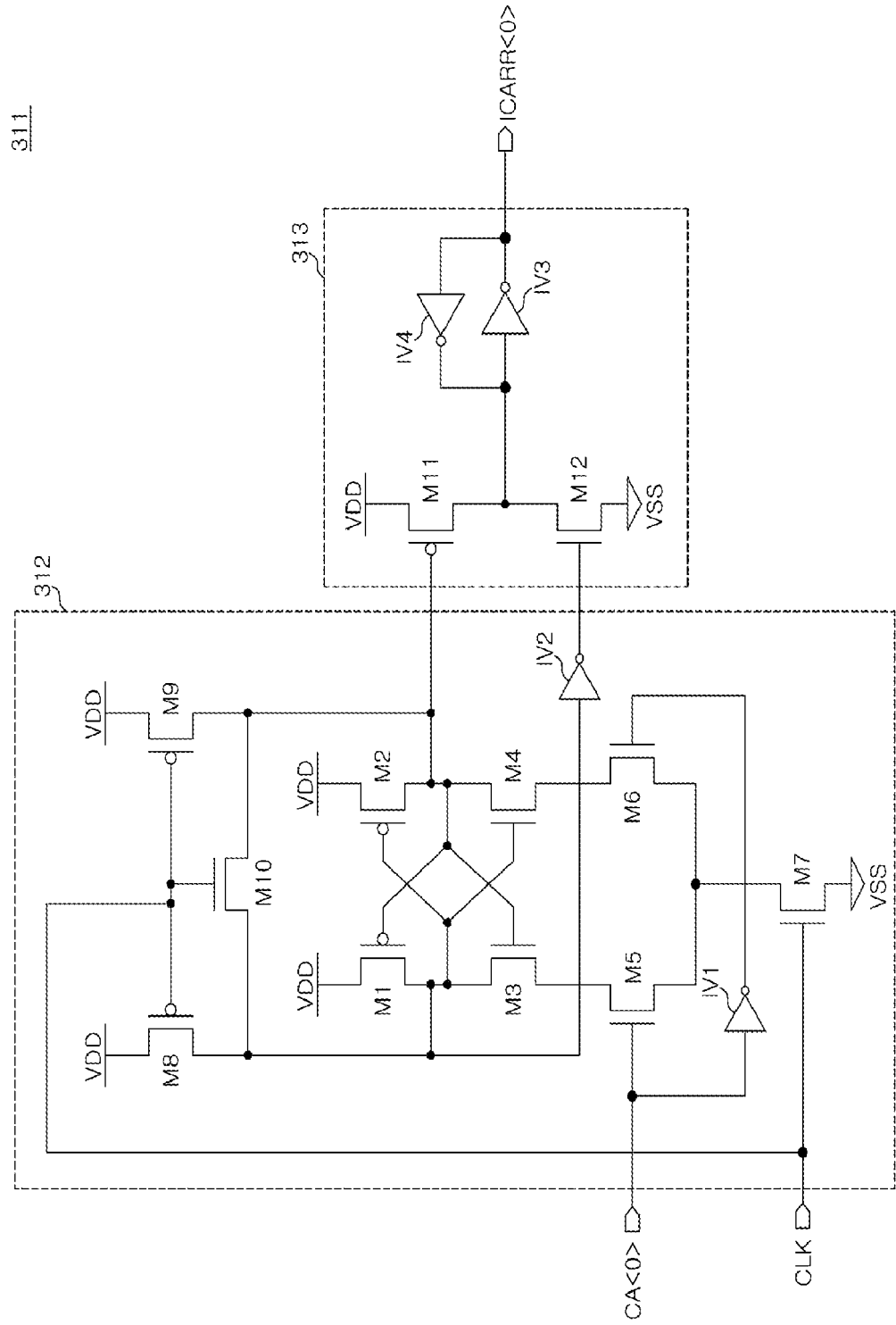
FIG. 4 is a circuit diagram of a CARR latch that can be included in the circuit illustrated in FIG. 3.

FIG. 4 is a drawing illustrating the configuration of a CARR latch 311, receiving a command/address signal "CA<0>", among the plurality of CARR latches 311 of the first latch unit 310. The CARR latch 311 can include a cross coupled latch 312 and an output circuit 313, as shown in FIG. 4. The cross coupled latch 312 can include first to ninth transistors M1 to M9 and first and second inverters IV1 and IV2. The fifth and sixth transistors M5 and M6 can be configured to receive the command/address signal "CA<0>". The seventh transistor M7 can be configured to provide a current path so that the command/address signal "CA<0>" can be latched at a rising edge of the clock signal "CLK". The eighth to tenth transistors M8 to M10 can be configured to precharge the level of an output signal of the cross coupled latch 312 when the clock signal "CLK" is low. The output circuit 313 can be configured to maintain the level of the output signal "ICARR<0>" of the CARR latch 311 until the level of the output signal of the cross coupled latch 312 is changed. The output circuit 313 can include eleventh and twelfth transistors M11 and M12, and third and fourth inverters IV3 and IV4.

Figure 5:
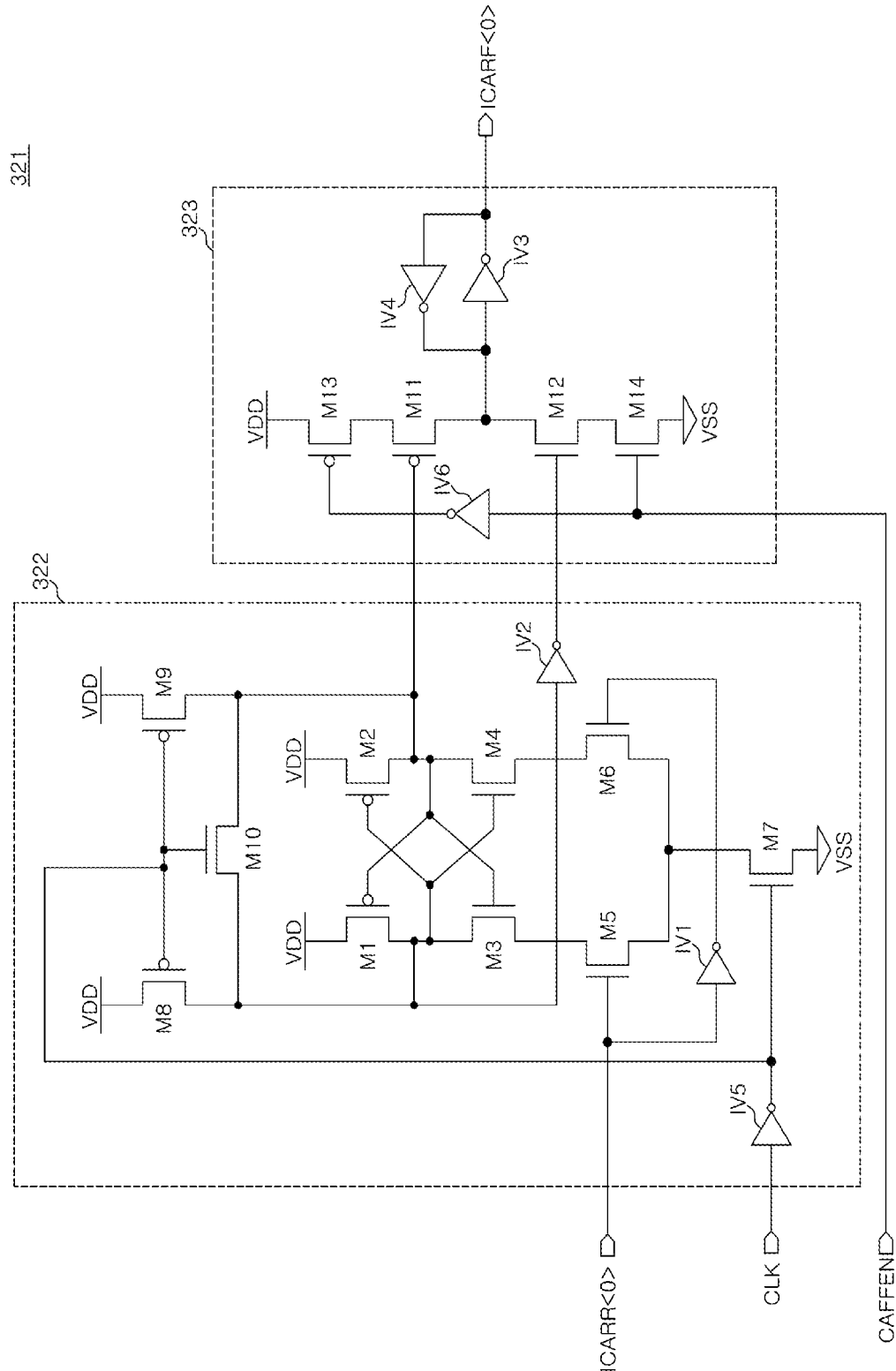
FIG. 5 is a circuit diagram of a CARF latch that can be included in the circuit illustrated in FIG. 3.

FIG. 5 is a drawing illustrating the configuration of a CARF latch 321, receiving the output signal "ICARR<0>" of the first latch unit 310, among the plurality of CARF latches 321 of the second latch unit 320. The CARF latch 321 can include a cross coupled latch 322 and an output circuit 323, as shown in FIG. 5. The cross coupled latch 322 can be configured to have the same structure as the cross coupled latch 312 shown in FIG. 4, except that the cross coupled latch 322 can further include a fifth inverter IV5 disposed at the clock signal input terminal so that it can latch the output signal "ICARR<0>" of the first latch unit 310 at a falling edge of the clock signal "CLK". The output circuit 323 can be configured to close a current path when the control signal "CAFFEN" is deactivated to prevent toggling of an output signal "ICARR<0>" of the CARF latch 321 according to an output signal of the cross coupled latch 322. The output circuit 323 can be configured by adding thirteenth and fourteenth transistors M13 and M14 and a sixth inverter IV6 to the configuration of the output circuit 313 shown in FIG. 4. When the control signal "CAFFEN" is deactivated, the sixth inverter IV6 can turn off the thirteenth and fourteenth transistors M13 and M14 so as to close the current path of the output circuit 323.

Figure 6:
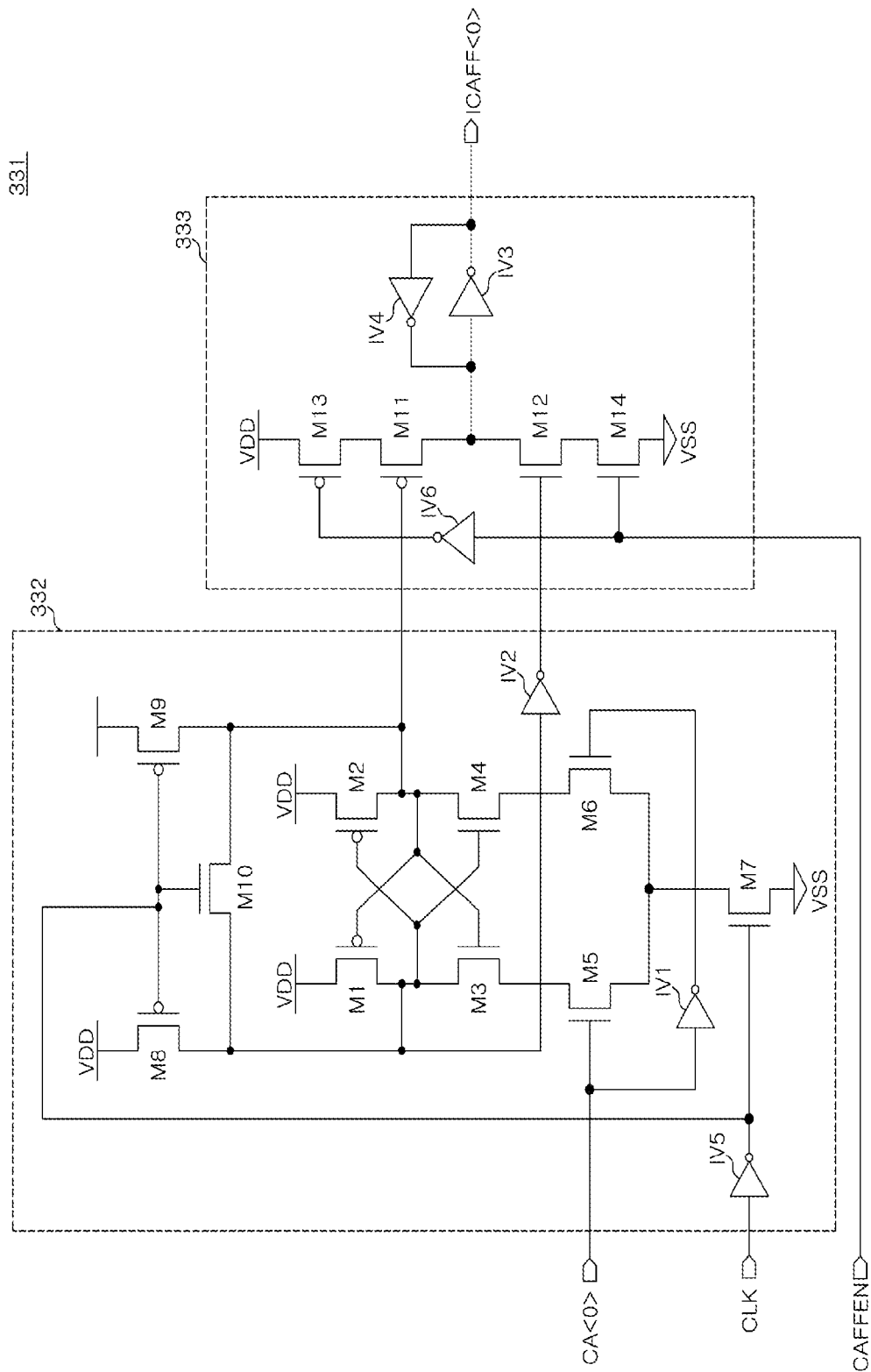
FIG. 6 is a circuit diagram of a CAFF latch that can be included in the circuit illustrated in FIG. 3.

FIG. 6 is a drawing illustrating the configuration of a CAFF latch 331, receiving the command/address signal "CA<0>", among the plurality of CAFF latches 331 of the third latch unit 330, according to one embodiment. The CAFF latch 331 can include a cross coupled latch 332 and an output circuit 333, as shown in FIG. 6. The CAFF latch 331 can be configured to have the same structure as the CARF latch 321 shown in FIG. 5.

Figure 7:
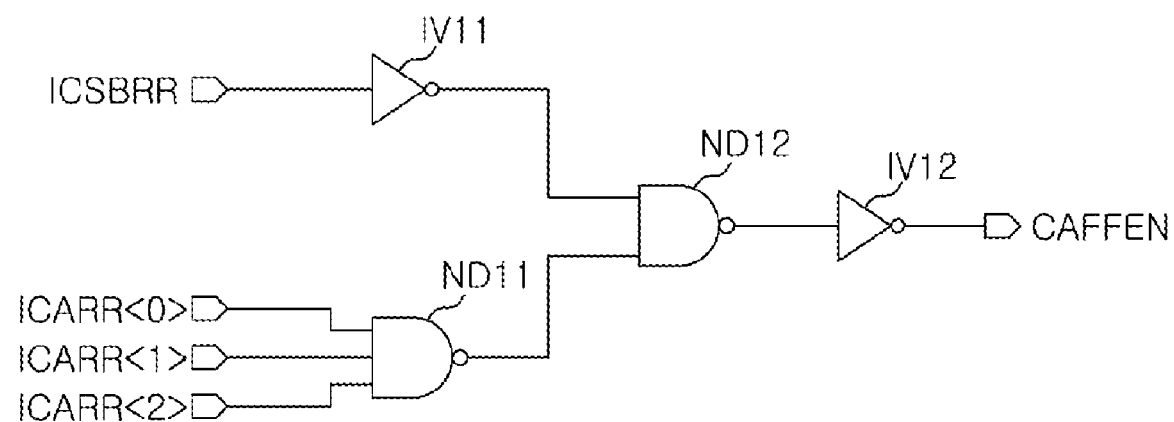
FIG. 7 is a circuit diagram of a control unit that can be included in the circuit illustrated in FIG. 3.

As shown in FIG. 7, the control unit 400 can be configured to use the latched chip-selection-signal "ICSBRR" and some of the output signals "ICARR<0: #>" of the first latch unit 310 to determine whether the semiconductor memory apparatus is in a non-operation mode, and to deactivate the control signal "CAFFEN" when it is determined that the semiconductor memory apparatus is in the non-operation mode.

The control unit 400 can include first and second inverters IV11 and IV12 and first and second NAND gates ND11 and ND12. The first inverter IV11 can receive the latched chipselection-signal "ICSBRR". The first NAND gate ND11 can receive the output signals "ICARR<0:2>" of the first latch unit 310. The second NAND gate ND12 can receive an output signal of the first inverter IV11 and an output signal of the first NAND gate ND11. The second inverter IV12 can receive an output signal of the second NAND gate ND12 and can output the control signal "CAFFEN".

Whether the semiconductor memory apparatus is in the non-operation mode can be determined by the chip selection signal "/CS" and the command/address signals "CA<0:2>". When the chip selection signal "/CS" is deactivated, e.g., a high level, or when all bits of the command/address signals "CA<0:2>" have a predetermined level, for example, a high level, then the semiconductor memory apparatus will not perform any active operation such as a read or write operation. Therefore, the semiconductor memory apparatus does not need to receive the command/address signals "CA<0:#>".

The chip selection signal "/CS" and the command/address signals "CA<0:2>" can be external signals. Therefore, in order to determine the operation mode inside an actual semiconductor memory apparatus, the internal signals of the semiconductor memory apparatus should be used. Furthermore, one of the internal signals having the earliest timing relative to the other signals should be used to ensure a sufficient operation margin.

For this reason, according to the embodiments described herein, the control unit 400 can be configured to determine whether the semiconductor memory apparatus is in the non-operation mode, according to a combination of the latched chip-selection-signal "ICSBRR" obtained by latching the chip selection signal "/CS" and the output signals "ICARR<0:2>" of the first latch unit 310 obtained by latching the command/address signals "CA<0:2>", and to deactivate the control signal "CAFFEN" when it is determined that the semiconductor memory apparatus is in the non-operation mode. Therefore, toggling of the latched signals of the second latch unit 320 and the third latch unit 330 can be prevented according to the control signal "CAFFEN".

According to the embodiments described herein, whether the semiconductor memory apparatus is in the non-operation mode can be determined according to the latched chip-selection-signal "ICSBRR" and the output signals "ICARR<0:2>" of the first latch unit 310. For this reason, the first input unit 200 and the first latch unit 310 of the second input unit 300 shown in FIG. 3 can be configured to operate regardless of the control signal "CAFFEN".

FIG. 8 is a timing chart illustrating the operation of input circuit 100 according to one embodiment. Referring to FIG. 8 when the control signal "CAFFEN" is active, the first input unit 200 and the second input unit 300 each can latch an input signal and can output the latched signal. In other words, the first input unit 200 can latch the chip selection signal "/CS" at a rising edge of the clock signal "CLK" and output the latched chip-selection-signal "ICSBRR".

The first latch unit 310 can latch the command/address signal "CA<0>" at the rising edge of the clock signal "CLK" and output the latched signal "ICARR<0>". The second latch unit 320 can latch the output signal "ICARR<0>" at a falling edge of the clock signal "CLK" and outputs the latched signal "ICARF<0>". The third latch unit 330 can latch the command/address signal "CA<0>" at a falling edge of the clock signal "CLK" and output the latched signal "ICAFF<0>".

Meanwhile, when the control signal "CAFFEN" is inactive, the second latch unit 320 and the third latch unit 330 each can maintain the level of the output signal thereof regardless of any variations in the level of the input signal since the current path is closed by the control signal "CAFFEN".

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An input circuit for a semiconductor memory apparatus, comprising:
    a input unit configured to selectively latch a plurality of external signals and output the latched signal; and
    a control unit configured to control the operations of the input unit according to an operation mode of the semiconductor memory apparatus,
    wherein the control unit is configured to selectively use a chip selection signal and a command/address signal to determine the operation mode of the semiconductor memory apparatus.

2. The input circuit of claim 1, wherein the input unit includes a plurality of latches, the plurality of latches is each configured to latch the plurality of external signals using different timing.

3. The input circuit of claim 1, wherein the input unit includes a plurality of latches, each of the plurality of latches includes a current path, and wherein the control unit is configured to control the operation of the plurality of latches by controlling the current paths included therein.

4. The input circuit of claim 3, wherein the control unit is configured to control the operations of certain latches of the plurality of latches configured to receive signals not used to determine the operation mode of the semiconductor memory apparatus.

5. The input circuit of claim 1, wherein the control unit is configured to determine that the semiconductor memory apparatus is in a non-operation mode when the chip selection signal is deactivated, or when some bits of the command/address signal are at a predetermined level.

6. The input circuit of claim 5, wherein the input unit includes a plurality of latches, the control unit is configured to selectively stop the operations of the plurality of latches when it is determined that the semiconductor memory apparatus is in the non-operation mode.

7. An input circuit for a semiconductor memory apparatus, comprising:
    a plurality of latches each configured to selectively latch a plurality of external signals and to output a latched signal according to a control signal; and
    a control unit configured to use the latched signals to determine an operation mode of the semiconductor memory apparatus, and to generate the control signal according to the determined operation mode,
    wherein the control unit is configured to determine that the semiconductor memory apparatus is in a non-operation mode when a chip selection signal is deactivated or when some bits of command/address signals are at a predetermined level.

8. The input circuit of claim 7, wherein the plurality of latches are each configured to selectively latch the plurality of external signals at a rising edge or a falling edge of a clock signal.

9. The input circuit of claim 7, wherein each of the plurality of latches includes a current path, and wherein the control unit is configured to control the operation of the plurality of latches by controlling the current paths included therein.

10. The input circuit of claim 7, wherein the control unit selectively uses a latched signal, having been latched at the earliest timing, among the latched signals to determine whether the semiconductor memory apparatus is in a non-operation mode.

11. The input circuit of claim 10, wherein the control unit is configured to generate the control signal having a level for stopping the operations of latches outputting latched signals not used in the non-operation mode, when it is determined that the semiconductor memory apparatus is in the non-operation mode.

12. The input circuit of claim 7, wherein the control unit includes:
 a first logic element configured to receive the chip selection signal;
 a second logic element configured to receive some bits of the command/address signals; and
 a third logic element configured to generate the control signal by combining an output signal of the first logic element and an output signal of the second logic element.

13. An input circuit for a semiconductor memory apparatus, comprising:
 a first latch configured to latch a chip selection signal using a first timing and to output an output signal;
 a plurality of second latches configured to latch command/address signals at the first timing and to output the latched signals as output signals;
 a plurality of third latches configured to latch the command/address signals at a second timing later than the first timing according to a control signal and to output the latched signals as output signals; and
 a control unit configured to use the output signal of the first latch and the output signals of the plurality of second latches to determine an operation mode of the semiconductor memory apparatus, and to generate the control signal according to the determined operation mode.

14. The input circuit of claim 13, wherein the first latch is configured to latch the chip selection signal at a rising edge of a clock signal and to output the latched chip-selection-signal, and the second latches are configured to latch the command/address signals at a falling edge of the clock signal and to output the latched signals.

15. The input circuit of claim 13, wherein each of the plurality of third latches includes a current path, and
 wherein the control unit is configured to control the operation of the plurality of latches by controlling the current paths included therein.

16. The input circuit of claim 13, wherein the control unit includes:
 a first logic element configured to receive the chip-selection-signal;
 a second logic element configured to receive some bits of the command/address signals; and
 a third logic element configured to generate the control signal by combining an output signal of the first logic element and an output signal of the second logic element.

17. A method of controlling an input circuit for a semiconductor memory apparatus having a plurality of latches for latching external signals, the method comprising:
 determining whether the semiconductor memory apparatus is in a non-operation mode based on the state of certain external signals used to control the operation of the semiconductor memory apparatus; and
 selectively stopping operations of the plurality of latches when it is determined that the semiconductor memory apparatus is in a non-operation mode,
 wherein the external signals includes a chip selection signal and command/address signals.

18. The method of claim 17, wherein the determining of whether the semiconductor memory apparatus is in the non-operation mode includes determining that the semiconductor memory apparatus is in the non-operation mode when the chip selection signal is deactivated or when some bits of the command/address signals become a predetermined level.

19. The method of claim 17, wherein the selectively stopping of the plurality of latches is stopping operations of certain latches of the plurality of latches used to latch external signals not used in the non-operation mode when it is determined that the semiconductor memory apparatus is in the non-operation mode.

20. The method of claim 19, wherein the selectively stopping of the plurality of latches includes closing current paths of the latches latching the external signals not used in the non-operation mode.

* * * * *